(12) United States Patent
Zade

(10) Patent No.: US 6,339,389 B1
(45) Date of Patent: Jan. 15, 2002

(54) METHOD OF TESTING ANALOG TO DIGITAL CONVERTERS

(75) Inventor: Hosein Mohamad Zade, Surrey (GB)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/320,239

(22) Filed: May 26, 1999

(51) Int. Cl.$^7$ ................................................. H03M 1/10
(52) U.S. Cl. .................................... 341/120; 341/155
(58) Field of Search .............................. 341/120, 155

(56) References Cited

U.S. PATENT DOCUMENTS

| | | | | |
|---|---|---|---|---|
| 4,031,462 A | * | 6/1977 | Bouvier et al. | 324/76.22 |
| 4,763,105 A | * | 8/1988 | Jenq | 341/120 |
| 4,788,492 A | * | 11/1988 | Schubert | 714/724 |
| 5,159,337 A | * | 10/1992 | Lankreijer | 341/67 |
| 5,195,530 A | * | 3/1993 | Shindel | 600/544 |
| 5,361,067 A | * | 11/1994 | Pinckley | 341/120 |
| 5,712,633 A | * | 1/1998 | Bae | 341/120 |
| 5,774,085 A | * | 6/1998 | Yanagimoto et al. | 341/155 |
| 5,781,138 A | * | 7/1998 | Knudsen | 341/143 |
| 5,818,370 A | * | 10/1998 | Sooch et al. | 341/120 |
| 5,867,410 A | * | 2/1999 | Smallcombe et al. | 364/724.011 |
| 5,891,041 A | * | 4/1999 | Shinomura et al. | 600/459 |
| 5,914,592 A | * | 6/1999 | Saito | 324/121 |
| 5,995,033 A | * | 11/1999 | Roeckner et al. | 341/155 |
| 6,016,113 A | * | 1/2000 | Binder | 341/131 |

FOREIGN PATENT DOCUMENTS

| | | | | |
|---|---|---|---|---|
| GB | 2337882 | * | 1/1999 | 341/120 |
| JP | 357171807 A | * | 10/1982 | H03B/1/00 |

* cited by examiner

*Primary Examiner*—Michael Tokar
*Assistant Examiner*—Steven S. Paik
(74) *Attorney, Agent, or Firm*—Mitchell Silberberg & Knup L.L.P.

(57) ABSTRACT

A method of analyzing ADCs, comprising providing a test waveform, sampling the test waveform in an ADC at a frequency different from the test waveform, providing the output samples of the ADC to a logic analyzer means, storing the output samples over a predetermined time interval in memory in the logic analyzer means, and providing from the stored samples, a graphical visual representation of the sampled test waveform.

24 Claims, 3 Drawing Sheets

$F_{Beat}$ = 11KHz
$F_{Noise}$ = 3MHz

METHOD OF TESTING ANALOG TO DIGITAL CONVERTERS

The present invention relates to a method of testing analog to digital converters (ADCs).

High speed ADCs are used in many varieties of applications; each application may require special consideration of one or more particular parameter. For example, designers of video (radar or TV) would pay particular attention to differential gain and phase, whereas designers using the ADC for radar would need to pay attention to aperture jitters. Other systems may need accurate information on analog power bandwidth or bit error rate. Specification requirements therefore differ from application to applications, and this can make comparisons of ADCs difficult. Therefore, it is important for both the design and system engineers to use special methods in order to evaluate the device's parameters. The evaluation methods falls into two categories. The first group utilises high speed Digital to Analog Converters (DACs) to reconstruct the digital output into an Analog form that can be displayed on an oscilloscope. The second group of methods looks directly at the digital data and uses DSP algorithms to analyse and extract all DC and AC errors.

Beat frequency testing is a quantitative test for ADC (Analog to Digital Converter) dynamic performance and may be used to quickly judge whether or not there are any gross problems with the ADC. In this technique, a full scale sinewave input signal is offset slightly in frequency from the ADC's sample rate. This frequency offset is selected such that on successive cycles of the input sinewave, the ADC output ideally would change by 1 LSB at the point of maximum slope (Slew rate's maximum point over one period of the input sinewave). Thus, the ADC sample point "walks" through the input signal as shown in FIG. 1. When the data stored in memory is reconstructed using a low speed DAC (Digital to Analog Converter), the beat frequency, $\Delta f$ is observed. Differential non linearities show up as horizontal lines in the observed beat frequency waveform and missing codes show up as gaps The large codes would appear as a widening of the differential codes appearing on the sinewave.

The envelope test is a variation of the beat frequency test in which the beat frequency $\Delta f$ is selected such that the ADC output would be at the extreme ends of its range on successive cycles of the input sine wave. Like the beat frequency test, the envelope test is a qualitative test but is much more demanding on an ADC because it places a worst case slew condition on the unit's input. This condition represents the most stringent test of a converter's settling time.

In the beat frequency test, the samples "walk" through the input waveform, each output code ideally changing by 1 LSB. The offset frequency for a 1 LSB change on successive samples for an N bit ADC can be computed from the following (assuming a full scale input sinewave):

$$\Delta f = f_s / 2^N \pi$$

Where $\Delta f$=Offset frequency $f_s$=Sampling Rate $f_s + \Delta f$=Input frequency N=Number of Bits in the ADC A known method of testing AID converters is to use a DAC as a reconstruction device and view the output response on a high speed, high resolution scope in order to verify linearity and dynamic parameters such as bandwidth, slew and distortion. This is normally performed by inputting a pure sinewave to the ADC under the test at nyquist and clock frequencies and observing the beat frequency generated.

This method has disadvantages, since it requires a high resolution DAC (higher than ADC by at least 2 bits) with a very low linearity error. It also requires use of external low pass filters to eliminate aliasing effects due to DAC. The time and effort required in identifying, constructing necessary boards and circuits is substantial. Additionally, the constructed analog output requires a high resolution, high speed analog scope with limited waveform manipulation such as data storage and data communication.

SUMMARY OF THE INVENTION

The purpose of this invention is to provide a method that reduces time and effort when evaluating high speed ADCs (especially integrated circuits) in the initial phases of design and development.

In a first aspect, the invention provides a method of analysing ADCs, comprising providing a test waveform, sampling the test waveform in an ADC at a frequency different from the test waveform, providing the output samples of the ADC to a logic analyser means, storing the output samples over a predetermined time interval in memory in the logic analyser means, and providing from the stored samples, a graphical visual representation of the sampled test waveform.

In a further aspect, the invention provides a system for analysing ADCs, comprising a source of a test waveform coupled to the input of an ADC, logic analyser means coupled to the output bus of the ADC, clock means for clocking the ADC at a frequency different from that of the test waveform, the logic analyser means including means for storing the output samples of the ADC, and including means for reconstructing from the stored samples, in visual graphical form, the test waveform sampled by the ADC.

In accordance with the invention, the visual representation of the test waveform, sampled at a beat frequency, may be observed and assessed to give rapidly information on various parameters of the ADC, as described below.

For the purposes of this specification, "logic analirser" means a device for accepting digital input samples on a parallel bus, storing the samples, and having means for displaying the stored samples in graphical form visually. A logic analyser is a well known tool used for trouble shooting digital circuits and debugging software problems. A personal computer may be used as a logic analyser, provided that suitable analysis software is loaded into the PC.

In this method, instead of using a DAC, an appropriate Logic Analyser with typical memory depth of around 4k or higher can be employed with graph (chart) reconstruction capability. When the analyser is set to the state analysis mode the output code can be viewed as a graph of states versus time. By conveniently adjusting the ADC input in real time the constructed waveform will represent each individual digital value into a time mapped sample value.

Beat frequencies generated will provide information on the dynamic behaviour of the ADC under the test. It must be noted that the beat frequency method if specifically useful when the display memory size is limited and device is operated at high input and clock frequencies. At these frequencies over sampling techniques depending on the display memory size would cause the state values to interleave hence making the analysis valueless.

This method eliminates the need for oscilloscope, DAC and Low pass filters and reduces parasitic artefact caused by extra interconnections and pcb's.

This invention allows fast evaluation of the Analog to Digital Converters at the different phases of the design and development. By examining the beat frequencies one can easily observe and identify the full power bandwidth, slew rate, distortion (flat spots), offset, comparator symmetries (flash types only) and other related parameters of interest for the ADC under test. Depending of the measurement results a designer quickly decide whether a full analysis using other methods such as DSP techniques is required or specific simulation and modification of the IC's circuitry is preferred.

BRIEF DESCRIPTION OF THE DRAWINGS

A preferred embodiment of the invention will now be described with reference to the accompanying drawings.

DESCRIPTION OF THE PREFERRED EMBODIMENT

Figure 1:
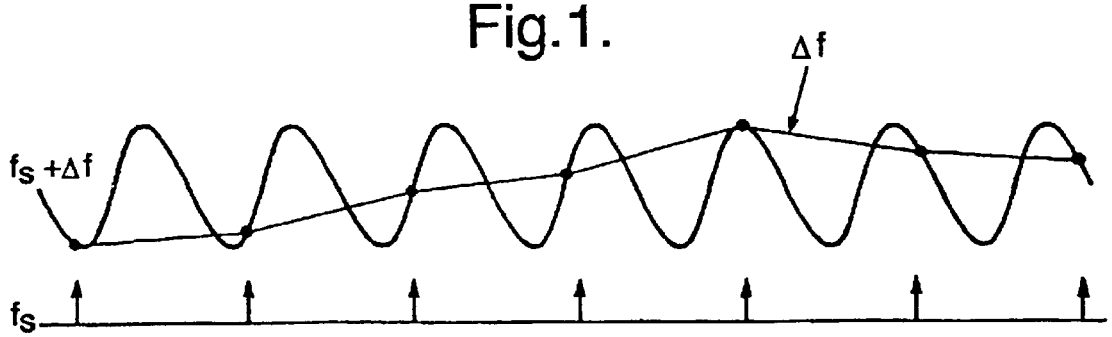
FIG. 1 is a waveform diagram of a known method of testing an ADC, known as the beat frequency test.
Figure 2:
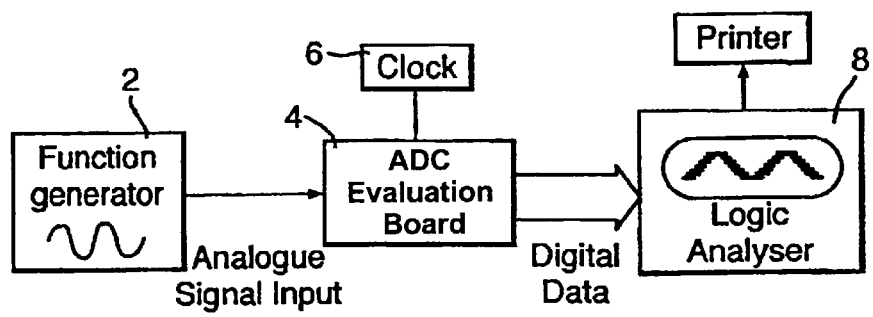
FIG. 2 is a schematic block diagram of a system for testing an ADC in accordance with the invention.

Referring to FIG. 2, a pure sinewave signal front a Function Generator 2 is input to the an Analog to Digital Converter which is mounted on an evaluation board 4. The ADC is sampled by an external clock 6. For this test it is important for the function generator to have a very low phase noise and clock generator to provide a very low jitter clock pulses as otherwise the linearity of the ADC could be effected. The data from the parallel output bus of the ADC board is collected by the parallel input of a high speed logic analyser 8. Logic analyser is a tool used for trouble shooting digital circuits and debugging the software problems. The employed logic analyser is designed for use by digital and microprocessor hardware and software designers. It has HP-ID, RS-232, and Ethernet Lan interfaces for hard copy printouts, post processing of measurement data, and control by a host computer. It has 16 channels and each channel memory depth of 64 Kbytes in full channel state. Measurement data is displayed as waveforms or state data listings or chart. State data can be compared bit by bit to a user defined reference image. In the state listing, the user can choose to display either sample clock transitions or both sample clock and over sampling clock transitions In timing waveform display, the user can show state values integrated in the waveform.

In this method instead of using a DAC an appropriate logic analyser with typical memory depth of around 4k or higher can be employed with graph (chart) reconstruction capability. When the analyser is set to the state analysis mode the output code can be viewed as a graph of sample magnitude versus time. By conveniently adjusting the A)C input in real time the constructed waveform will represent each individual digital value into a time mapped sample value.

Beat frequencies gene rated will provide information on the dynamic behaviour of the ADC under the test. It must be noted that the beat frequency method is specifically useful when the display memory size is limited and device is operated at high input and clock frequencies. At these frequencies over sampling techniques depending on the display memory size would cause the state values to interleave hence making the analysis less valuable.

This invention allows fast evaluation of the Analog to Digital Converters at different phases of the design and development. By examining the beat frequencies one can easily observe and identify the fall power bandwidth, slew rate, distortion (flat spots), offset comparator symmetries (flash types only) and other related parameters of interest for the ADC under test. Depending on the measurement results a designer can quickly decide whether a full analysis using other methods such as DSP techniques is required or specific simulation and modification of the ICs circuitry is preferred. FIGS. 3–7 show the samples of the actual evaluation results obtained during progressive development stages of an Analog to Digital (Converter. The technique enabled fast debugging of the product and hence reduced the development cycle.

Figure 3:
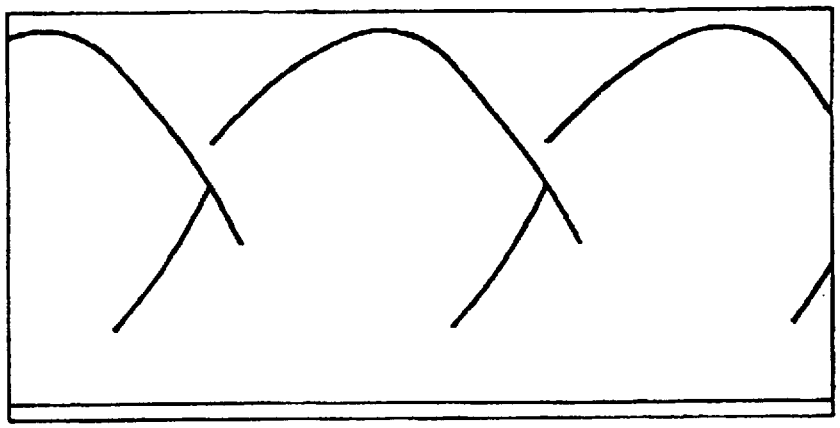
FIGS. 3 to 7 are various waveforms obtained with the system according to the invention.

Thus FIG. 3 shows an initial version of an ADC. The reconstructed waveform has various non-linearities and distortions in particular slow rate.

Figure 4:
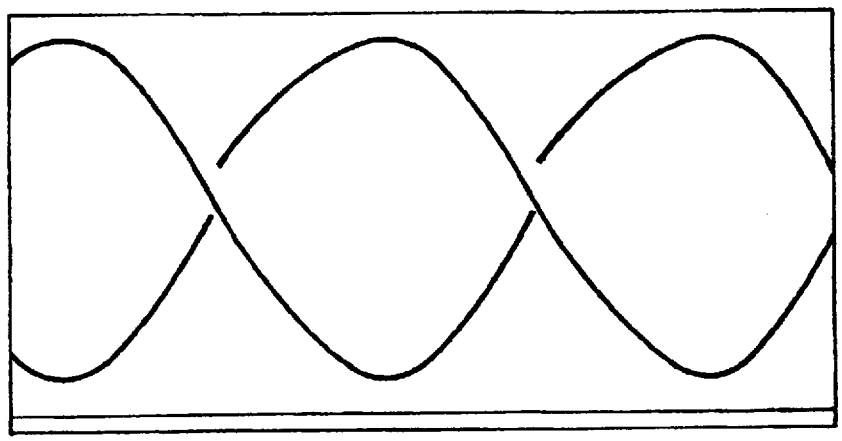

FIG. 4 shows a second version of the ADC, with the major problems of the first version removed, but still having distortions in slow rate.

Figure 5:
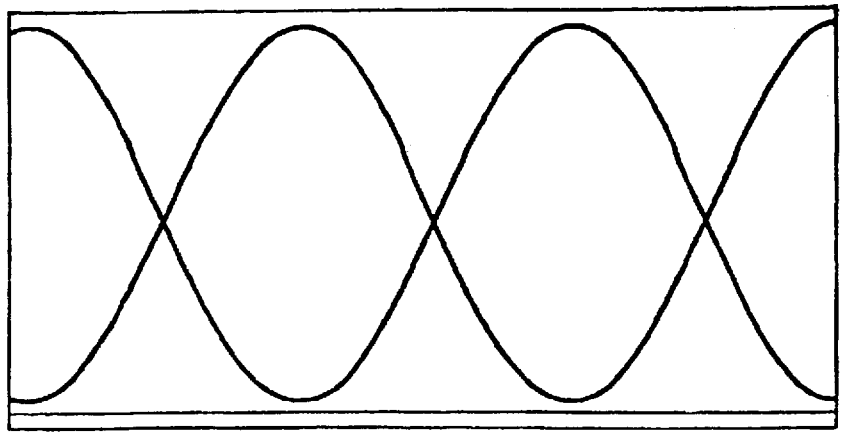

FIG. 5 shows a third version of the ADC, with the distortions of FIG. 4 removed. Further improvement of the ADC characteristics would require DSP analysis instead of a visual observation method.

Figure 6:
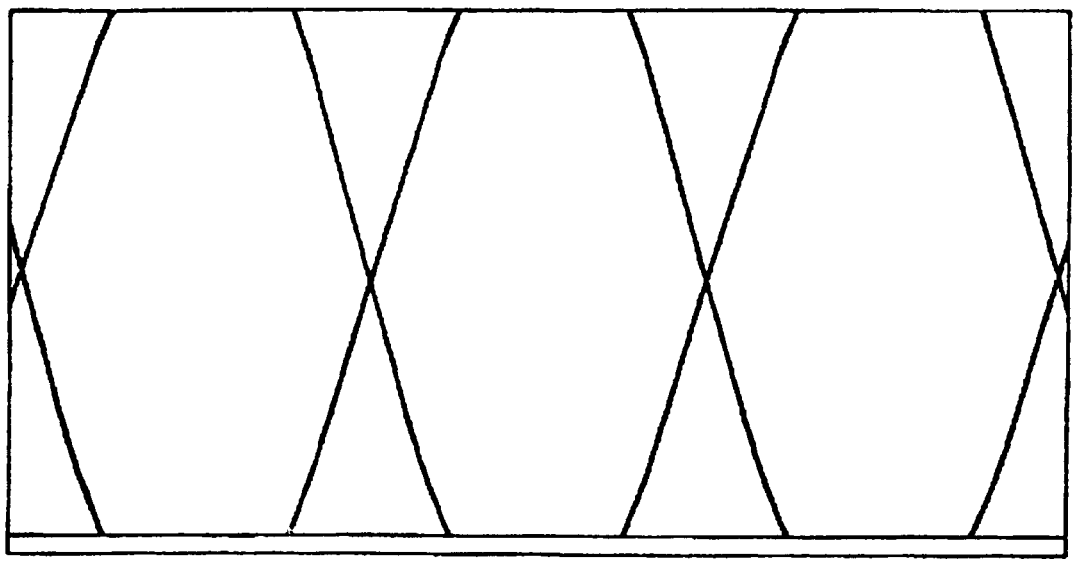

FIG. 6 shows the third version when overdriven by a waveform voltage three to four times greater than the rated voltage of the ADC.

Figure 7:
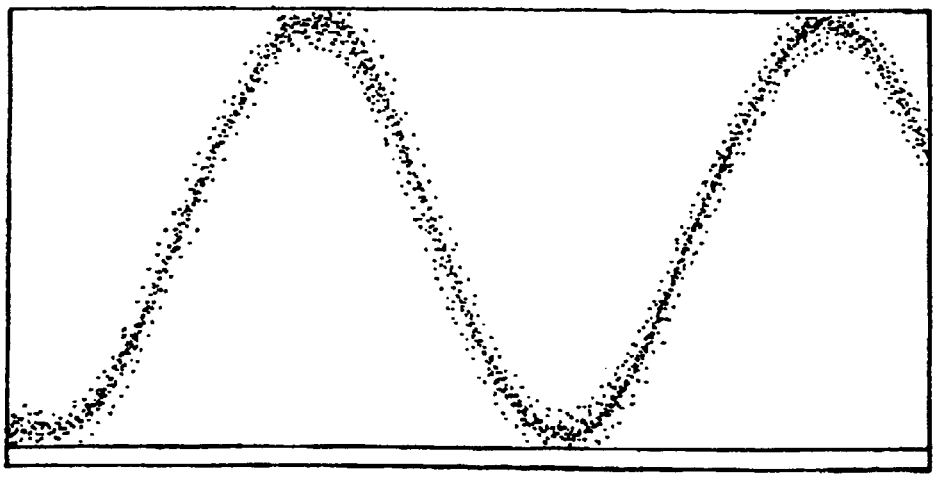

FIG. 7 shows the third version subject to a further test, wherein a noise signal is injected at a predetermined frequency, for observing the reaction of the ADC to a noisy signal.

What is claimed is:

1. A method of analysing ADCs, comprising:
   providing a test waveform;
   sampling the test waveform in an analog-to-digital converter (ADC) at a frequency different from the test waveform;
   providing the output samples of the ADC to a logic analyser means;
   storing the output samples in memory in the logic analyser means;
   providing from the stored samples a graphical visual representation of the sampled test waveform; and
   assessing the sampled test waveform to obtain information on the ADC.

2. The method according to claim 1, wherein the ADC is controlled by an external clock.

3. The method according to claim 1 or 2, comprising providing the output samples of the ADC over a parallel bus to inputs of the logic analyser means.

4. A method according to claim 1, wherein the test waveform has very low phase noise.

5. A method according to claim 1, wherein the sampling of the test waveform is performed by clocking the ADC using clock pulses having very low jitter.

6. A method according to claim 1, wherein the test waveform is a pure sinewave.

7. A method according to claim 1, wherein the frequency used to sample the test waveform is a beat frequency of the frequency of the test waveform.

8. A method according to claim 1, wherein the frequency used to sample the test waveform is only slightly offset from the frequency of the test waveform.

9. A method according to claim 1, wherein the samples of the test waveform walk through the test waveform.

10. A method according to claim 1, wherein consecutive samples of the test waveform differ by approximately 1 LSB at a point where the test waveform has a maximum slope.

11. A method according to claim 1, wherein $\Delta f = f_s/2^N \pi$, where $f_s$ is the frequency for sampling the test waveform, $f_s + \Delta f$ is the frequency of the test waveform, and N is a number of bits output by the ADC for each sample.

12. A method according to claim 1, wherein the logic analyser means is set to a state analysis mode.

13. A system for analysing ADCs, comprising:
- an analog-to-digital converter (ADC) mounted on an evaluation board;
- a source of a test waveform coupled to an input of the ADC;
- logic analyser means coupled to an output bus of the ADC; and
- clock means for clocking the ADC at a frequency different from that of the test waveform,
- the logic analyser means including means for storing the output samples of the ADC, and including means for reconstructing from the stored samples, in visual graphical form, the test waveform sampled by the ADC.

14. The system according to claim 13, including external clock means for controlling the ADC.

15. The system according to claim 13 or 14, wherein the output bus of the ADC is a parallel bus, and is connected to parallel inputs of the logic analyser means.

16. A system according to claim 13, wherein the test waveform has very low phase noise.

17. A system according to claim 13, wherein the sampling of the test waveform is performed by clocking the ADC using clock pulses having very low jitter.

18. A system according to claim 13, wherein the test waveform is a pure sinewave.

19. A system according to claim 13, wherein the frequency used to sample the test waveform is a beat frequency of the frequency of the test waveform.

20. A system according to claim 13, wherein the frequency used to sample the test waveform is only slightly offset from the frequency of the test waveform.

21. A system according to claim 13, wherein the samples of the test waveform walk through the test waveform.

22. A system according to claim 13, wherein consecutive samples of the test waveform differ by approximately 1 LSB at a point where the test waveform has a maximum slope.

23. A system according to claim 13, wherein $\Delta f = f_s/2^N \pi$, where $f_s$ is the frequency for sampling the test waveform, $f_s + \Delta f$ is the frequency of the test waveform, and N is a number of bits output by the ADC for each sample.

24. A system according to claim 13, wherein the logic analyser means is set to a state analysis mode.

* * * * *